(12) United States Patent
Bismuth

(10) Patent No.: US 11,662,372 B2
(45) Date of Patent: May 30, 2023

(54) MEASURING INPUT CAPACITANCE WITH AUTOMATIC TEST EQUIPMENT (ATE)

(71) Applicant: Nuvoton Technology Corporation, Hsin-chu (TW)

(72) Inventor: Alain Bismuth, Kibbutz Beth Rimon (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 99 days.

(21) Appl. No.: 17/411,070

(22) Filed: Aug. 25, 2021

(65) Prior Publication Data

US 2021/0382101 A1 Dec. 9, 2021

Related U.S. Application Data

(62) Division of application No. 16/537,579, filed on Aug. 11, 2019, now abandoned.

(51) Int. Cl.
*G01R 27/26* (2006.01)

(52) U.S. Cl.
CPC ............... *G01R 27/2605* (2013.01)

(58) Field of Classification Search
CPC .................................. G01R 27/2605
See application file for complete search history.

(56) References Cited

U.S. PATENT DOCUMENTS

| | | | |
|---|---|---|---|
| 2003/0057990 A1* | 3/2003 | West | G01R 31/31924 324/750.01 |
| 2007/0300196 A1* | 12/2007 | Ishibashi | G06F 30/3312 716/113 |

* cited by examiner

*Primary Examiner* — Noam Reisner
(74) *Attorney, Agent, or Firm* — Kligler & Associates Patent Attorneys Ltd

(57) ABSTRACT

A method for measuring an input capacitance of a pin of an electronic device includes, using a tester including Pin Electronics (PE), obtaining a first capacitance measurement while the pin is disconnected from the PE, and a second capacitance measurement while the pin is connected to the PE. The input capacitance of the pin is calculated from the first and second capacitance measurements.

7 Claims, 5 Drawing Sheets

502

SET_LEVEL(PIN1, 0.0V, 3.0V, 1V, 2V, 1mA, 0mA, 3.0V,) // PULL-UP

504

SET_LEVEL(PIN1, 0.0V, 3.0V, 1V, 2V, 0mA, -1mA, 0.0,V) // PULL-DOWN

*FIG. 5*

```
1  PIN_PAT
2  PIN1, PIN2, PIN3, PIN4, PIN5, PIN6, PIN7, PIN8, PIN9, PIN10,
3  RESET, IN1, IN2, OUT1, CLK          ←—602
4  3600_WAVE
5  x/   = DX,  DX,  IOFF, DX,  SX,  SX,   ON,  OFF;
6  n/N  = DX,  DX,  ION,  DX,  SX,  SX,   ON,  OFF;
7  a/A  = DTP, DX,  ION,  DX,  SX,  SX,   ON,  OFF;
8  h/H  = DX,  DX,  IOFF, DX,  STP, STP/, OFF, ON;
10 MAIN_PAT
11 pat_InCap {
12 /*
13              P R
14   PPPPPPPPPI E  O
15   IIIIIIIIIN SIIUC
16   NNNNNNNNN1 ENNTL
17   1234567890 T121K    ←—602
18 */
19 *nnnnnnnnnn nnnnn* Super0_0 ;
20 *aaaAaAAaAA AAaAa* Super0_0 ;
21 *aaaAaAAaAA AAaAa* Super0_0 ;
22 *aaaAaAAaAA AAaAa* Super0_0 ;
23 *aaaAaAAaAA AAaAa* Super0_0 ;
24 *aaaaaaaaaa Aaaaa* Super0_0 ;  ~608
25 *hhhhhhhhhh Ahhhh* Super0_0 ;  ~610
26
29
27
28
29
```

MEASURING INPUT CAPACITANCE WITH AUTOMATIC TEST EQUIPMENT (ATE)

CROSS-REFERENCE TO RELATED APPLICATIONS

This application is a division of U.S. patent application Ser. No. 16/537,579, filed Aug. 11, 2019, whose disclosure is incorporated herein by reference.

FIELD OF THE INVENTION

The present invention relates generally to automated test equipment (ATE), and particularly, to the characterizing a of Device Under Test (DUT) input capacitance in an ATE.

BACKGROUND OF THE INVENTION

Automatic test equipment (ATE) performs tests on a device, (will be referred to hereinbelow as Device Under Test, or DUT). When the DUT is an electronic component, such as an integrated circuit (IC), the ATE typically applies voltage and current patterns to the DUT inputs, and measures voltages and currents at the DUT outputs.

ATE can also be used for device characterization—the measurement of DUT parameters under varying conditions.

A summary of ATE technology, including hardware and software, can be found in "Automatic Test Equipment," Wiley Encyclopedia of Electrical and Electronics Engineering, 1999, by F. Liguori, pages 110-120.

SUMMARY OF THE INVENTION

An embodiment of the present invention that is described herein provides a method for measuring an input capacitance of a pin of an electronic device. The method includes, using a tester including Pin Electronics (PE), obtaining a first capacitance measurement while the pin is disconnected from the PE, and a second capacitance measurement while the pin is connected to the PE. The input capacitance of the pin is calculated from the first and second capacitance measurements.

In some embodiments, obtaining each of the first and second capacitance measurements includes driving the PE with one or more predefined currents using a current source, and measuring one or more respective voltages that form across the PE responsively to the currents. In an example embodiment, the one or more predefined voltages include at least two voltages, and calculating the input capacitance includes deriving from the voltages a voltage slope as a function of time, and calculating the input capacitance from the voltage slope.

In another embodiment, obtaining the first and second capacitance measurements includes prompting a user to disconnect the pin from the PE before obtaining the first capacitance measurement, and prompting the user to connect the pin to the PE before obtaining the second capacitance measurement.

There is additionally provided, in accordance with an embodiment of the present invention, an apparatus for measuring an input capacitance of a pin of an electronic device. The apparatus includes Pin Electronics (PE) configured to connect to the pin, and a controller. The controller is configured to obtain a first capacitance measurement while the pin is disconnected from the PE, and a second capacitance measurement while the pin is connected to the PE, and to calculate the input capacitance of the pin from the first and second capacitance measurements.

There is further provided, in accordance with an embodiment of the present invention, a computer software product for measuring an input capacitance of a pin of an electronic device, the product including a tangible non-transitory computer-readable medium in which program instructions are stored, which instructions, when read by a processor that is coupled to Pin Electronics (PE) configured to connect to the pin, causes the processor to obtain a first capacitance measurement while the pin is disconnected from the PE, and a second capacitance measurement while the pin is connected to the PE, and to calculate the input capacitance of the pin from the first and second capacitance measurements.

The present invention will be more fully understood from the following detailed description of the embodiments thereof, taken together with the drawings in which:

BRIEF DESCRIPTION OF THE DRAWINGS

FIG. 5 is a DC setup screen shot of an ATE, in accordance with an embodiment of the present invention; and FIG. 6 is a screen shot of an ATE test pattern, in accordance with an embodiment of the present invention.

DETAILED DESCRIPTION OF EMBODIMENTS

Overview

Figure 1:
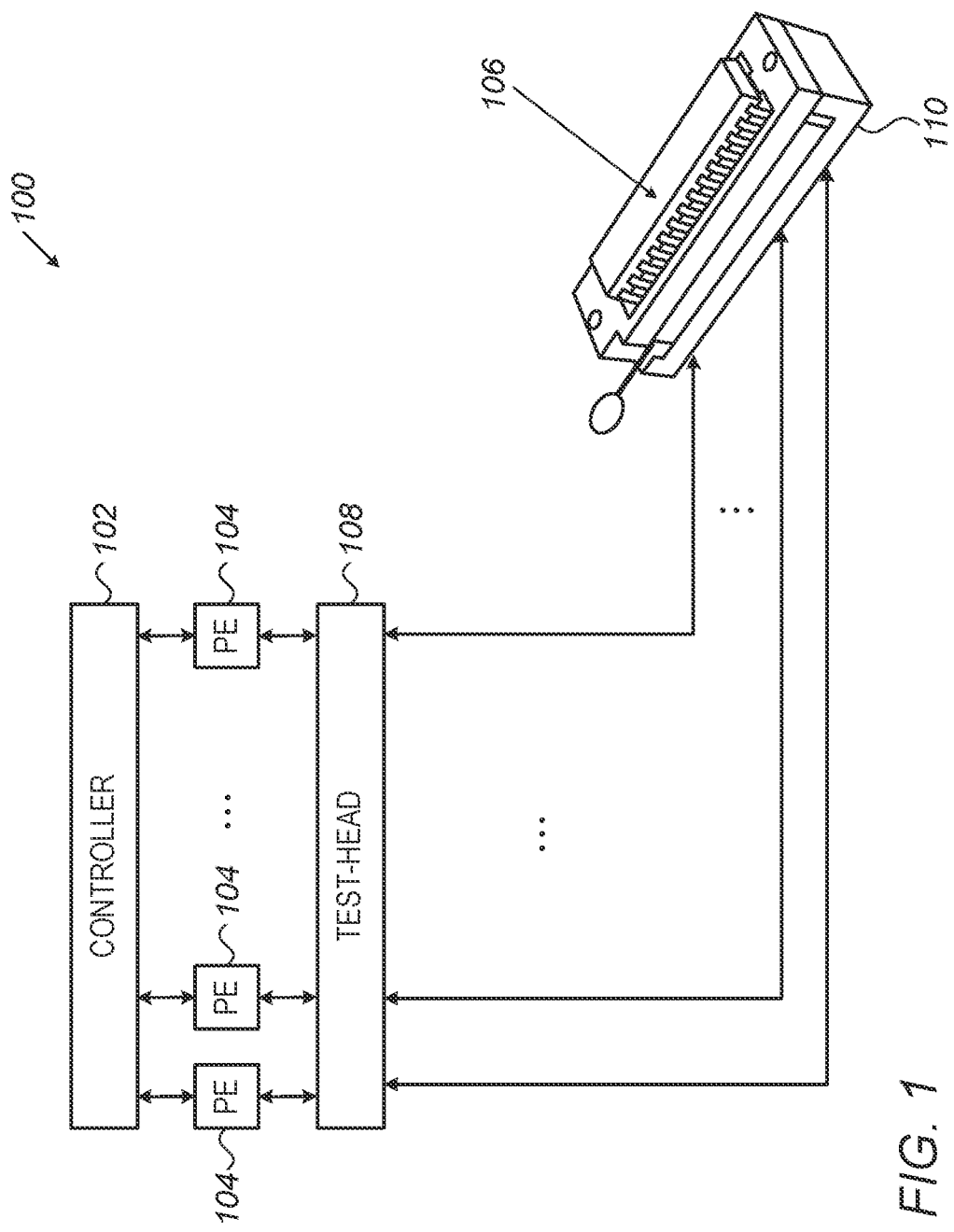
FIG. 1 is a block diagram that schematically illustrates an Automatic Test Equipment (ATE), in accordance with embodiments of the present invention.

Testing devices for the automatic testing of electronic systems and integrated circuits are referred to as Automatic Test Equipment (ATE). ATEs can be used for device testing (such as wafer-sort or assembly-sort) and for device characterization (e.g.,—measurement of the device parameters under varying conditions).

The ATE typically comprises "pin electronics" (PE) modules, which are coupled to pins of the Device-Under-Test (DUT). It should be noted that the term PE may alternatively refer to the aggregation of electronic circuits that are coupled to the DUT pins. In the description hereinbelow we will use the term PE to describe an electronic circuit that is coupled to a single DUT pin. The techniques described hereinbelow also apply, mutatis mutandis, to the alternative definition of PE.

Each PE can be controlled to either drive a DUT pin or to measure the voltage level (and/or the current) of a DUT pin. Conventionally, when a PE is coupled to a DUT input pin, the PE will drive the DUT pin; when the PE is coupled to a DUT output pin, the PE will measure the DUT pin; and when the PE is coupled to a DUT Input-Output (I/O) pin, the PE will, at different time periods, drive or measure the DUT pin, as controlled by the ATE software.

Direct Current (DC) specifications of output pins of a DUT typically define, for each pin, a minimum and/or a maximum voltage that the pin output should meet, when loaded with a preset DC current. For logic pins of the DUT, two parameters are typically defined—VOH—the minimum logic-1 voltage level of the pin while sourcing a DC current that is equal to IOH; and, VOL—the maximum logic-0 voltage level of the pin while sinking a DC current that is equal to IOL. Typical values for the DC parameters may be:

VOH=2.4V;
VOL=0.45V;
IOH=400 µA; and
IOL=16 mA.

To test that the DUT output pins meet the DC specifications, the PE typically comprises a programmable current source, that can be configured to sink IOH or source IOL, and one or more voltage comparators, that are configured to compare the voltage level on the DUT output pin to a preset voltage (e.g., VOL or VOH). For testing, the tester drives the input pins of the DUT with a sequence of voltages, which causes the output pin to output known logic values. Then, the tester probes the voltage comparator in the corresponding PE, and checks the output of the voltage comparator, to verify that the output pin voltage is higher than VOH (for logic-high output) or lower than VOL (for logic-low output).

The DUT Alternating Current (AC) parameters are typically specified as the time that it takes for DUT pins to reach a preset threshold voltage, starting with a change in one of the input pins of the DUT (e.g., a rising edge on the clock input), when the DUT pin is loaded with a predefined load (e.g., 50 pf). Two parameters are typically defined—Tr—the time for a positive edge signal on the DUT output pin to reach VH (typically 2.0V), and Tf—the time for a negative edge signal on the DUT output to reach VL (typically 0.8V). (The DC and AC specifications parameters described above are abbreviated; more information on DC and AC specification of integrated circuits can be found, for example, in the Automatic Test Equipment, by F. Liguori, cited above.)

To test that the DUT meets the AC specifications, the PE further comprises one or more programmable timers, that are configured to sample the voltage comparators a preset time after a corresponding change in a DUT input pin. For example, to test a Tr parameter of a DUT output pin, The ATE will program the voltage threshold of the comparator to VIH (volts) and will program the timer to sample the comparator Tr (nano-seconds) following the rising edge of the clock (which is typically also driven by the ATE).

As would be appreciated, various calibration techniques may be applied to the simplified description above. For example, the timer may be configured to compensate for delays in the clock output, from the tester to the DUT pin and for sampling delays of the comparator.

Conventionally, input pins of the DUT are driven rather than measured (with some exceptions), according to the stimuli of the test pattern. The slopes of rising and falling edges of the input pins may be constant or controlled. U.S. patent application Ser. No. 16/269,573, which is assigned to the assignee of the present patent application and whose disclosure is incorporated herein by reference, describes how a programmable-slew-rate edge can be applied to the input pin of a DUT, by coupling current sources, which are traditionally used for testing output pins, to input pins.

According to embodiments of the present invention, an ATE system comprises software to generate test-patterns. A test routine comprises static PE configuration scripts and dynamic test patterns. The configuration scripts configure drivers and comparators of the PE. For example, the logic-high and logic-low voltage levels with which a PE should drive a DUT input pin (VIH and VIL, respectively), the logic low and logic high voltage levels with which a PE should test a DUT output pin (VOH and VOL), and the load-high and load-low currents with which the PE should load a DUT output pin (IOH, IOL), are statically configured, and remain unchanged during dynamic test pattern execution.

In embodiments according to the present invention, the dynamic test patterns dynamically define, for some or for all the DUT pins, the driving of DUT input pins and the measurement (including the expected results) of the DUT output pins, at different time periods. Traditionally, the time axis is divided to discrete time slots, and the dynamic test pattern defines the drive and measurement (e.g. expected results) characteristics in time-slot resolution.

According to embodiments, to drive the DUT pins, PE modules typically comprise a driver with two signal levels: input-low voltage (VIL), and input-high voltage (VIH). Static configuration scripts typically set VIL and VIH values for each of the PE modules, and the dynamic test pattern defines, for each time slot wherein the PE drives the DUT pin, whether the PE should drive the pin with VIH or VIL. For example, a PE may be statically configured to VIL=0.8V and VIH=2.0V, and the dynamic test pattern for the PE may specify 1-1-0-0-1. The PE will drive the DUT pin with signal levels of 2.0V in the first and second time slots, 0.8V in the third and fourth time slots, and 2.0V in the fifth time slot.

The measurement circuitry of the PE, in accordance with embodiments of the present invention, typically comprises two parts—comparators and load control. The comparators are configured to compare the voltage level on the DUT pin to two voltage levels that are set by a configuration script—Output-Low voltage (VOL), and Output-High voltage (VOH). In time slots where the measurement part (e.g. expected results) of the dynamic test pattern specifies that a logic-high on the pin should be tested, the PE verifies that the voltage on the pin exceeds VOH. In time slots where the test pattern specifies that a logic-low on the pin should be tested, the PE verifies that the voltage on the pin is below VOL.

In an embodiment, the Load control is configured to apply one of two programmable load currents: Output-Low current (IOL) and Output-High current (IOH) to the DUT pin. The two current values are typically programmed in a configuration script (in the description hereinbelow we will refer to current flow from the PE to the pin as positive current, and current from the pin to the PE is negative. Alternatively, we will refer to driving current as "sourcing current", and, to receiving current as "sinking current"). In time slots where the test pattern indicates that the pin is to be tested for logic low, the PE will apply a current equal to IOL to the DUT pin, and when the test pattern indicates that the pin is to be tested for logic high, the PE will apply a current equal to IOH (typically negative) to the DUT pin.

For example, a test script may define, for a DUT pin, that logic-low level (VOL) should be no more than 0.4V with a load current (IOL) of 1.6 mA, and logic-high level (VOH) should be no less than 2.0V with a load current (IOH) of −0.1 mA. The dynamic test pattern, for that output pin, is, in the current example, 1-1-1-0-1-1. The PE will drive the pin with −0.1 mA and check that the pin voltage is more than 2.0V in time slots 1, 2, 3, 5, 6. In time-slot 4 the PE will drive the pin with 1.6 mA and check that the pin voltage is below 0.4V.

Characterization

According to embodiments of the present invention, an ATE can characterize integrated circuits by measuring AC and DC parameters (as well as other parameters), over varying conditions (such as ambient temperature, supply voltage, etc.). The characterization process may comprise testing a plurality of devices, sometimes from different manufacturing lots, and calculating averages and standard deviations of the measured parameters.

In some embodiments, the PE of the ATE is configured to measure parameters such as VOH, VOL, Tr and Tf directly, using measurement circuitry. In other embodiments, parameter measurement may be done by the AC and DC testing circuitry of the PE, without additional circuitry. For example, in an embodiment, to measure VOH, the ATE repeatedly run tests with varying VOH voltage values; and, determine the actual value of VOH responsive to the results of the tests. In some embodiments, to test a parameter, the ATE initially sets the parameter to an extremum value (e.g. VOL=0V), and then increments (or decrements) the parameter by small values (e.g. 1 mV) in repetitive tests, logging the results of each test, until the other extremum is met. In other embodiments, measurement is done by a search, wherein the parameter value is incremented or decremented according to the pass/fail result of the previous test.

Traditionally some of the input parameters of integrated circuits are characterized by special equipment, or, sometimes, not characterized. For example, the capacitance of DUT input pins are usually specified but rarely characterized (or characterized using dedicated equipment). The difficulty associated with the measurement of the input capacitance stems from the stray capacitance of the ATE circuitry that is coupled to the DUT pin and is typically larger than the input capacitance of the pin.

(In the description hereinbelow, the term "pin capacitance" means the capacitance between the pin and one of the ground pins of the DUT.)

Embodiments according to the present invention that are disclosed herein provide for a simple method to measure the capacitance of the DUT input pins, using PE resources that are otherwise used for AC and DC testing of DUT output pins, without adding dedicated circuitry. Other embodiments provide for an apparatus for the testing and characterization of integrated circuits, wherein some of the apparatus circuitry may be configured to test AC and DC parameters of the DUT output pins, and, to measure the input capacitance of the DUT input pins.

In an embodiments, the method comprises taking a first capacitance measurement of the PE associated with the tested input pin when the DUT is not connected, and a second capacitance measurement of the PE when the DUT is connected, and, responsive to the two capacitance measurements, calculating the capacitance of the input pin (e.g., by subtracting the first capacitance measurement from the second capacitance measurement). (Note that the terms "first" and "second" above do not refer to the chronological order of the measurements.)

In some embodiments, taking a capacitance measurement between two leads comprises connecting one of the leads to a current source, and measuring a time T1 at which the voltage between the leads is equal to a first threshold voltage V1; measuring a time T2 at which the voltage is equal to a second threshold voltage V2; and, calculating the capacitance responsive to the two timing measurement and the current that the current source drives (for example, $C=I*(T2-T1)/(V2-V1)$, wherein I is the current source, in amps, T1 and T2 units are seconds, V1 and V2 units are volts).

In embodiments, one of the leads is the ground lead (or one of the ground leads) of the DUT; as the voltage on the ground lead is zero, we will refer hereinbelow to the other lead ("pin") only; the term "pin voltage" will refer to the voltage between the pin and a ground pin, and the term "pin capacitance" will refer to the capacitance between the pin and a ground pin.

In some embodiments according to the present invention, each PE comprises two voltage comparators. Each input pin of the DUT is connected, in parallel, to two voltage comparators of a respective PE, wherein the first voltage comparator compares the pin voltage to a first threshold, and the second voltage comparator compares the pin voltage to a second threshold voltage. In some embodiments, to measure the time in which the voltage on the pin is equal to a threshold, the PE is configured to test that the pin voltage exceeds the threshold at a given time which is initially set to zero; the tester then runs repetitive tests, increasing the time until the test passes. In another embodiment the time is initially set to a high value wherein the test fails, and then, in further tests, the time value is decremented, until the test passes.

In yet another embodiment a binary search is run in consecutive tests, as exemplified in Table 1:

TABLE I

| Binary Time Measurement | | |
|---|---|---|
| Time (ns) | Pass/fail | Delta to next step (ns) |
| 0 | Fail | +1024 |
| 1024 | Pass | −512 |
| 512 | Fail | +256 |
| 768 | Fail | +128 |
| 896 | Fail | +64 |
| 960 | Pass | −32 |
| 928 | Pass | −16 |
| 912 | Pass | −8 |
| 904 | Fail | +4 |
| 908 | Fail | +2 |
| 910 | Pass | −1 |
| 909 | | |

The Time is first set to 0, and the test fails. Then in successive steps, the time is incremented or decremented, according to the results of the previous test, by values that are half of the increment or decrement in the previous test, until the required measurement resolution is met (in the example embodiment of Table 1—time=909 ns is measured, with ins resolution).

It should be noted that although an ATE according to embodiments of the present invention mainly tests digital input pins, the method for measuring input capacitance described herein can be used for digital and analog input pins.

It should further be noted that in some embodiments, the disclosed techniques can be embodied in software that runs on a conventional tester, in some cases a simple, low-end tester. Thus, according to embodiments of the present invention, capacitance of DUT input pins can be tested and characterized by the ATE measurements circuits, with no additional circuitry.

System Description

FIG. 1 is a block diagram that schematically illustrates an Automatic Test Equipment (ATE) 100, in accordance with embodiments of the present invention.

ATE 100 comprises a Controller 102, configured to run software programs and to control the ATE operation, and a plurality of Pin Electronic modules (PE) 104, wherein each PE module 104 is configured to test and/or stimulate one of the pins of a Device Under Test (DUT) 106. The controller is coupled to the PE units using buses, wherein the controller communicates the configurations and dynamic test-patterns to the PEs, and the PEs communicate the test results back to the controller.

The number of PE units that are configured equals to the number of tested DUT pins (when the number of tested pins is lower than the number of PE modules, some of the PE modules may be turned off).

ATE 100 further comprises a Test Head 106 that is configured to interface to a socket 110 for characterization, or to load-boards (not shown) for wafer-level and assembled-device testing.

Socket 110 may be a Zero-Insertion-Force (ZIF) socket, which allows quick an easy insertion and extraction of DUTs.

The ATE can be configured for wafer-level testing or for packaged device testing (in testing nomenclature, wafer-level testing is referred to as "wafer-Sort", whereas packaged device testing is referred to as "assembly sort"), or, for device characterization.

To measure the capacitance of a DUT input pin, the controller configures a corresponding PE to couple a current source to the DUT pin, and measures the rate at which the voltage on the pin changes by running a series of tests (to be described below, with reference to FIG. 2). The controller then calculates the capacitance according to the rate and to the current source.

The ATE repeats the capacitance measurement described above twice; once when DUT 106 is inserted in ZIF 110, and once when the DUT is not inserted. The capacitance of the input pin can be calculated from the two measurements described above (e.g., by subtracting the capacitance measured when the DUT is not inserted from the capacitance measured when the DUT is inserted).

Thus, according to the example embodiment described with reference to FIG. 1, an ATE can measure and characterize input capacitance of DUT pins, using the same circuitry that the ATE uses for DC and AC testing.

As would be appreciated, the structure of ATE 100 described above is cited by way of example. ATEs in accordance to the disclosed techniques are not limited to the description hereinabove.

In some embodiments, the controller comprises a general-purpose processor and an interface board. In an embodiment, there is no interface board, and the computer communicates directly with PE units 104. In some embodiments, the controller comprises a plurality of processors; in other embodiments, there is no processor in the ATE, and the testing software runs on other computer or computers that are connected to the ATE through a communication network, such as the Internet.

Figure 2:
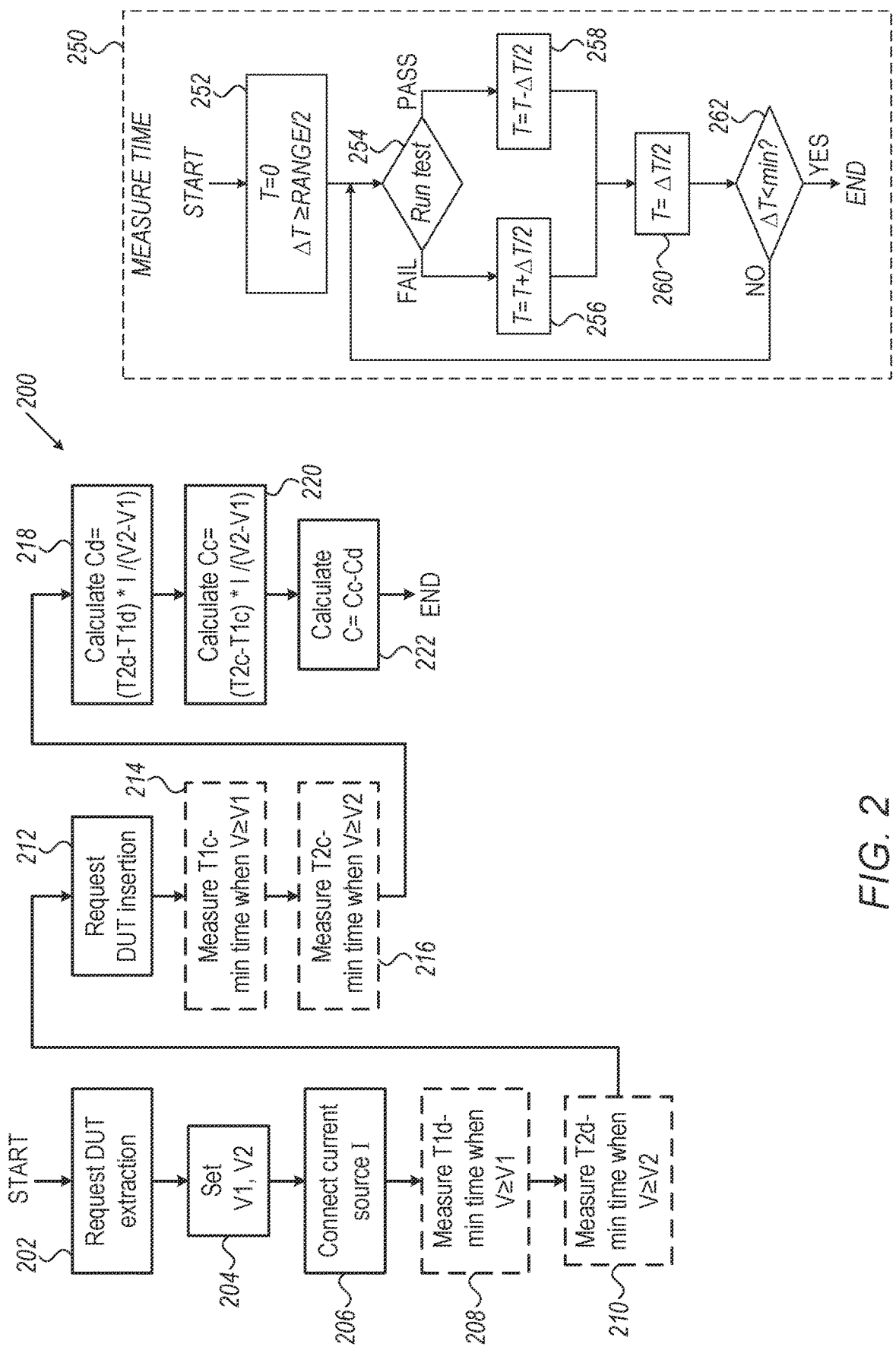
FIG. 2 is a flowchart that schematically describes a method for measuring capacitance of DUT input pins, according to embodiments of the present invention.

FIG. 2 is a flowchart 200 that schematically describes a method for measuring capacitance of DUT input pins, according to embodiments of the present invention. The flowchart is executed by controller 102 (FIG. 1).

The flow starts at a DUT-Extraction step 202, wherein the processor requests that a handler (not shown) extracts (or otherwise disconnect) DUT 106 from Socket 110 (FIG. 1) (in some embodiments, the extraction is done by a human user). After step 202, the controller enters a Setting Voltages step 204, and sets two threshold voltages in a PE 104 (FIG. 1) that corresponds to the tested pin—V1 and V2. The processor next enters a Connecting Current-Source step 206 and controls the PE to connect a current source with current=I to the pin.

After step 206, the controller enters a Measuring T1d step 208, wherein the controller measures the time period for the input pin voltage to climb from an initial low voltage (e.g., 0V Volt) to V1. The result is referred to as T1d–T1 when the DUT is disconnected (time measurement step 208 comprises sub-steps, which will be described below). After step 208, the controller enters a Measuring T2d step 210, wherein the controller measures the time period for the input pin voltage to climb from an initial low voltage to V2. The result is referred to as T2d—T2 when the DUT is disconnected (step 210 comprises the same sub-steps as step 208, which will be detailed below).

Steps 202 through 210 above measured parameters which are needed to calculate the stray capacitance—the capacitance of the wires and circuitry that are connected to the DUT pin. Next, the controller will measure the parameters that are needed to calculate the capacitance of the DUT pin when connected to the ATE. In a DUT-Insert step 212, the controller requests insertion of the DUT to the socket; The controller then, in a Measuring T1c step 214 measures T1 when the DUT is connected; and, in a Measuring T2c step 216 measures T2 when the DUT is connected.

After step 216, all measurements are done, and the controller can calculate the capacitance. In a Calculating Cd step 218, the controller calculates the capacitance when the DUT is disconnected, for example, according to the formula:

$$Cd=(T2d-T1d)*I/(V2-V1)$$

Next, in a Calculating Cc step 220, the controller calculates the capacitance when the DUT is connected, for example, according to the formula:

$$Cc=(T2c-T1c)*I/(V2-V1)$$

Finally, at a Calculating C step 222, the controller subtracts Cd from Cc, to get the input capacitance of the DUT pin.

Flow 250 describes the sub-steps of each of timing measurement steps 208, 210, 214 and 216. Executed by the controller, the flow measures the time for the DUT pin to reach a voltage level V. The flow starts at a Setting-T step 252, wherein the controller sets a timing variable T to a minimum value (0 according to the example embodiment of FIG. 2), and a ΔT timing variable to an initial value that is equal to or greater than half of the maximum expected T value. Next in a Running Test step 254, the controller runs the test, and checks if the test passes with T=0 (and, with further values of T, when step 254 is re-entered).

If, at step 254, the test fails, the controller enters an Incrementing-ΔT step 256, wherein T is incremented by half the value of ΔT. In a similar way, if the test passes at step 254, the controller enters a Decrementing-ΔT step 258, wherein T is decremented by half the value of ΔT.

After either step 256 or step 258, the controller enters an Updating ΔT step 260, and halves the value of ΔT. The processor then enters a Checking-minimum-ΔT step 262, and checks if the current value of ΔT is still not smaller than a minimum value (that is equal to the required measurement resolution). The flow ends if ΔT is smaller than the required resolution, or, if ΔT is not smaller than the resolution, the controller will re-enter step 254.

Thus, timing measurement flow 250 is, in effect, a binary search that measures the time in log 2(max_value/resolution) tests, where max_value is the maximum value that the T parameter may reach, and resolution is the measurement resolution.

In summary, flow 200 describes a method for calculating the input capacitance of DUT pins, comprising: a) connecting a preset current source to the DUT pin, b) with the DUT disconnected, take two timing measurements that corresponds to the time that the pin reaches a first and a second voltage threshold; c) with the DUT connected, take two more timing measurements corresponds to the time that the pin reaches the first and the second voltage thresholds; d) calculate C responsive to the four timing measurements.

Thus, according to the example embodiments described in FIG. 2, a method to measure the input capacitance of DUT input pins can be realized, which uses tester resources that are otherwise used to test AC and DC parameters of the DUT. The disclosed method is inexpensive in the sense that it does not require any hardware resources except resources that are used in AC and DC testing of the DUT.

As would be appreciated, the method described above with reference to the example embodiment of FIG. 2 is cited by way of example. Capacitance measurement methods in accordance to the disclosed techniques are not limited to the description hereinabove. In alternative embodiments, for example, steps 202 and 212 comprise an acknowledgement that the extraction/insertion are done (this is particularly true if a human operator executes the extraction/insertion). The order of the steps may change in various embodiments (for example, measurements with the DUT inserted may precede measurements with the DUT extracted; step 218 may be done after step 212, etc.).

In some embodiments, the V1 and V2 thresholds that are used when the DUT is extracted may be different than those used when the DUT is inserted (for example, to minimize measurement errors).

Time measurement flow 250 is one example of a timing measurement method, using binary search. While this method is fast, it is more susceptible to measurement errors. In some embodiments a slower linear method may be used, wherein the full range of expected timing results is tested, and the results are logged. The controller can then check the results, filter-off singular pass or fail events (that is—a pass result surrounded by multiple fail events, when T is both larger and smaller, or vice-versa) and derive a noise-filtered timing measurement.

In yet other embodiments, binary and/or linear searches may be executed multiple times, and the final timing parameter may be derived according to the results. For example, in an embodiment, a binary search is run twice; if the results agree, the timing measurement is done; if the results vary, a linear search is executed.

Figure 3A:
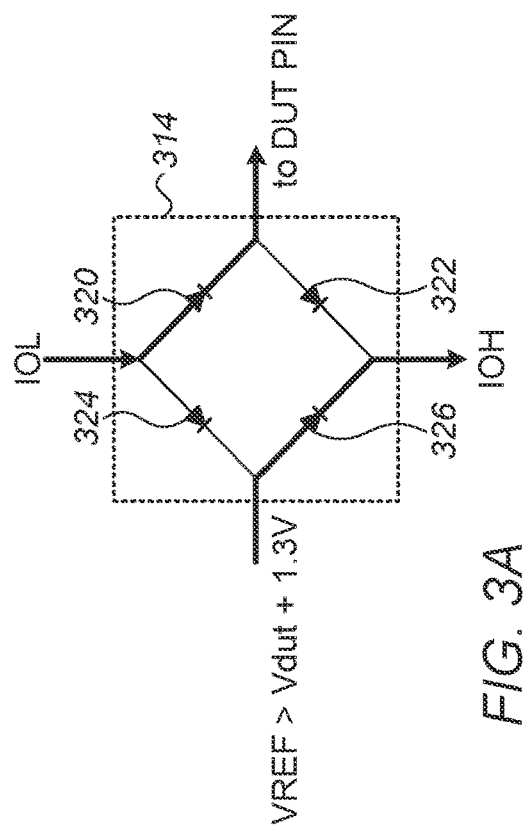
FIG. 3A is a block diagram that schematically describes driving an IOL current into the DUT pin.
Figure 3B:
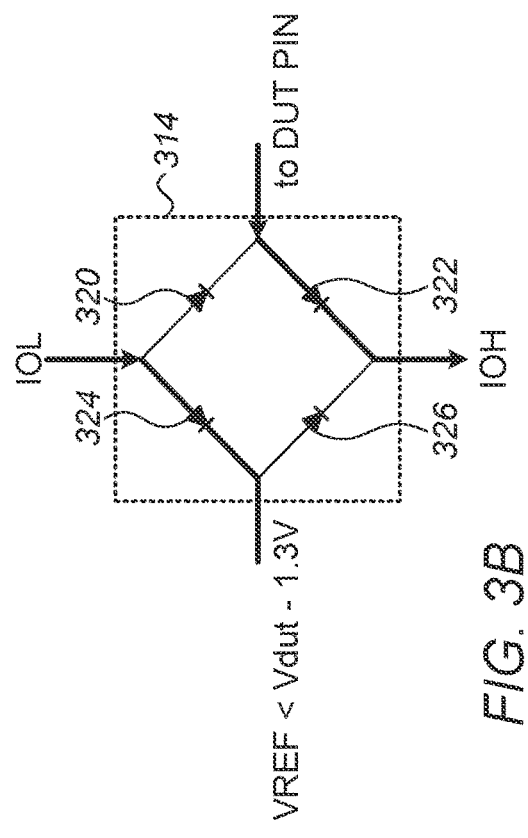
FIG. 3B is a block diagram that schematically describes sinking an IOH current from the DUT pin.
Figure 3:
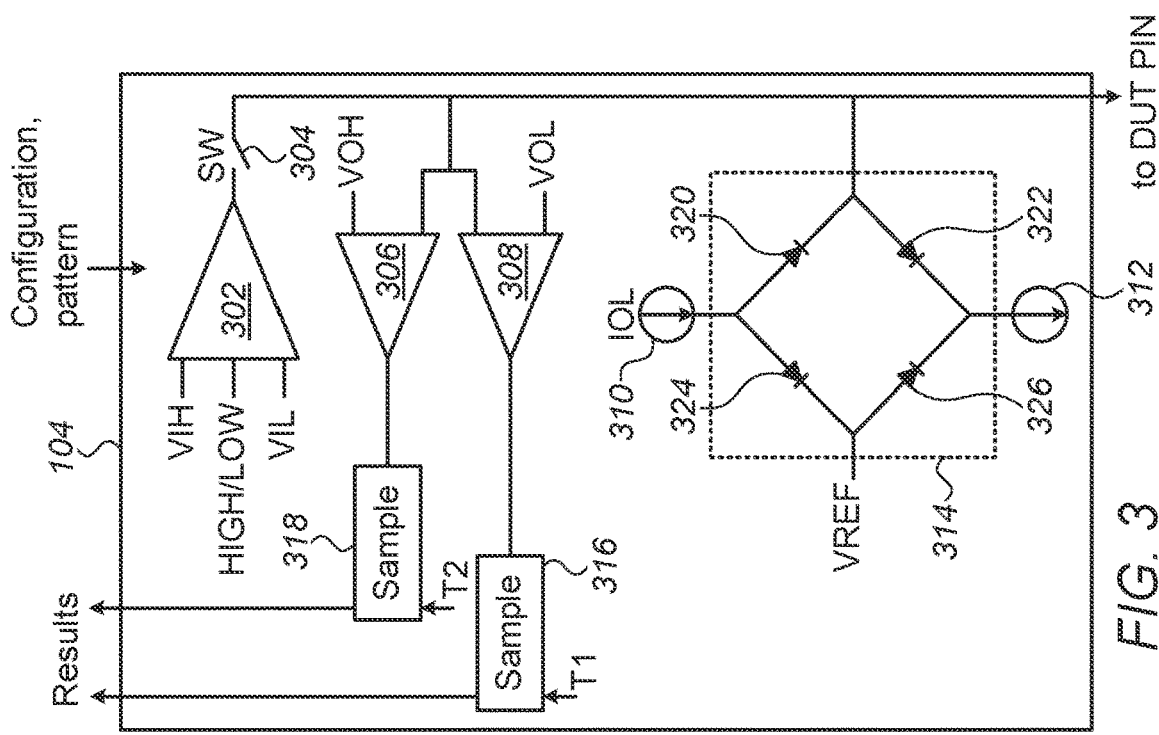
FIG. 3 is a block diagram that schematically describes the structure of a Pin Electronics (PE), according to embodiments of the present invention.

FIG. 3 is a block diagram the schematically describes the structure of a PE 104 (FIG. 1), according to embodiments of the present invention. The PE communicates with Controller 102, receiving configuration and pattern data and sending the test results. The PE is coupled to a wire that is connected, through test-head 108 and socket 110, to a single pin of DUT 106 (see FIG. 1).

To drive the DUT pin, PE 104 comprises a Programmable Driver 302, which is configured to output one of two pre-configured signal levels VIL, VIH, according to a control input (designated HIGH/LOW in the figure); and, a Switch 304, which is configured to connect or disconnect the programmable driver from the DUT pin.

To measure the DUT pin, each PE 104 comprises:
a VOH-Comparator 306, which is configured to verify that the voltage level at the DUT pin is above a pre-configured VOH;
a VOL-Comparator 308, which is configured to verify that the voltage level at the DUT pin is below a pre-configured VOL;
an IOL Programmable Current Source 310, which is configured to source a pre-configured current IOL;
an IOH Programmable Current Source 312, which is configured to sink a pre-configured current IOH; and
A Diode-Bridge 314, comprising four diodes and a programmable voltage source VREF. The Diode Bridge is configured to: a) when the voltage level on the DUT pin is lower than VREF—route the current sourced by IOL Current Source 310 to the DUT pin, and route current sunk by IOH Current Source 312 from the VREF voltage source; b) when the voltage level on the pin is higher than VREF—route the current sunk by IOH Programmable Current Source 312 from the DUT pin, and route the current sourced by IOL Current Source 310 to VREF voltage source (the functionality and operation of Diodes Bridge 314 will be further described, with reference to FIGS. 3A, 3B).

For AC testing, PE 104 further comprises a Sampler 316, which is configured to latch the output of VOL-Comparator 308 at time T1, and a Sampler 318, which is configured to latch the output of VOH-Comparator 306 at time T2.

The operation of Diodes Bridge 314 will now be explained, with reference to FIGS. 3A, 3B.

FIG. 3A is a block diagram that schematically describes driving an IOL current into the DUT pin. Vref is set to a voltage that is higher than the expected DUT output voltage by at least 1.3V—twice the threshold voltage of a silicon diode (for simplicity, we assume that the forward threshold voltage of a silicon diode is 0.65V). Diode 320 will conduct, sourcing IOL into the DUT pin. The voltage at the IOL port of the bridge will be Vdut+0.65V; hence, diode 324 will be reversed-biased and will not conduct. The current sunk by the IOH current source will be supplied from Vref, through diode 326; the voltage at the IOH port of the bridge will be Vref−0.65V=Vdut+0.65V. Diode 322 will be reversed-biased and will not conduct.

FIG. 3B is a block diagram that schematically describes sinking an IOH current from the DUT pin. Vref is set to a voltage that is lower than the expected DUT output voltage by at least 1.3V. Diode 322 will conduct, sinking IOH from the DUT pin. The voltage at the IOH port of the bridge will be Vdut−0.65V; hence, diode 326 will be reversed-biased and will not conduct. The current sourced by the IOL current source will be sunk by Vref, through diode 324; the voltage at the IOL port of the bridge will be Vref+0.65V=Vdut−0.65V. Diode 320 will be reversed-biased and will not conduct.

In summary, Controller 102 (FIG. 1) can control, for each DUT pin individually—
Whether the PE should drive or monitor the pin—according to the setting of switch 304;
If the PE drives the pin—determine if the PE will drive the pin with logic-low or logic-high, according to the setting of High/Low input of driver 302, and determine the driven voltage levels (VIH if the PE drives logic-high, and VIL if the PE drives logic-low);
If the PE monitors the pin—determine if the PE will couple the IOL current source (driving current into the pin) or the IOH current source (sinking current from the pin) by appropriately setting Vref voltage, and, determine the current source rating (by setting IOL and IOH);
If the PE monitors the pin—Set the testing thresholds VOL and VOH, to test the DUT logic-low and logic-high voltage levels for the voltage levels that the DUT drives; and,
For AC testing, select the rise time (T2) or fall-time (T1) parameters that the DUT pin must meet (typically, in AC testing, no current source is coupled to the pin).

(Note that the configuration may change frequently throughout the test. A pin may be tested for logic low in some time slots and for logic high in other slots, according to the dynamic test pattern. Moreover, IO pins, which are inputs at some time slots and output at others, can be alternately driven and tested, according to the dynamic test pattern.)

According to embodiments of the present invention, to measure input capacitance the PE couples a current source to the pin, and measures Tr or Tf.

Thus, an ATE with PEs in accordance with the example embodiment illustrated in FIGS. 3, 3A, 3B, can test and characterize the logic functions of a DUT, including characterizing the input capacitance of DUT pins, without adding dedicated capacitance measurement circuitry.

As would be appreciated, the structure of PE 104 described above is cited by way of example. PEs in accordance to the disclosed techniques are not limited to the description hereinabove. In some embodiments, additional circuitry may be coupled to each or some of the PEs, for example, for precision analog measurements. In an embodiment, Diode-Bridge 314 comprises similar functionality, implemented with a different circuitry. In embodiments, switch 304 may be an electro-mechanical relay, or an electronic switch.

Further embodiments described in the current patent application refer to methods for the measurement of the input pins of a DUT in an example commercial ATE (Chroma 3650-EX), using the DC and AC measurement circuitry of the tester. The example ATE is described in Chroma publication 3650-EX-E-201709-500—"SOC/ANALOG TEST SYSTEM MODEL 3650-EX," 2017, which is incorporated herewith by reference.

Figure 4:
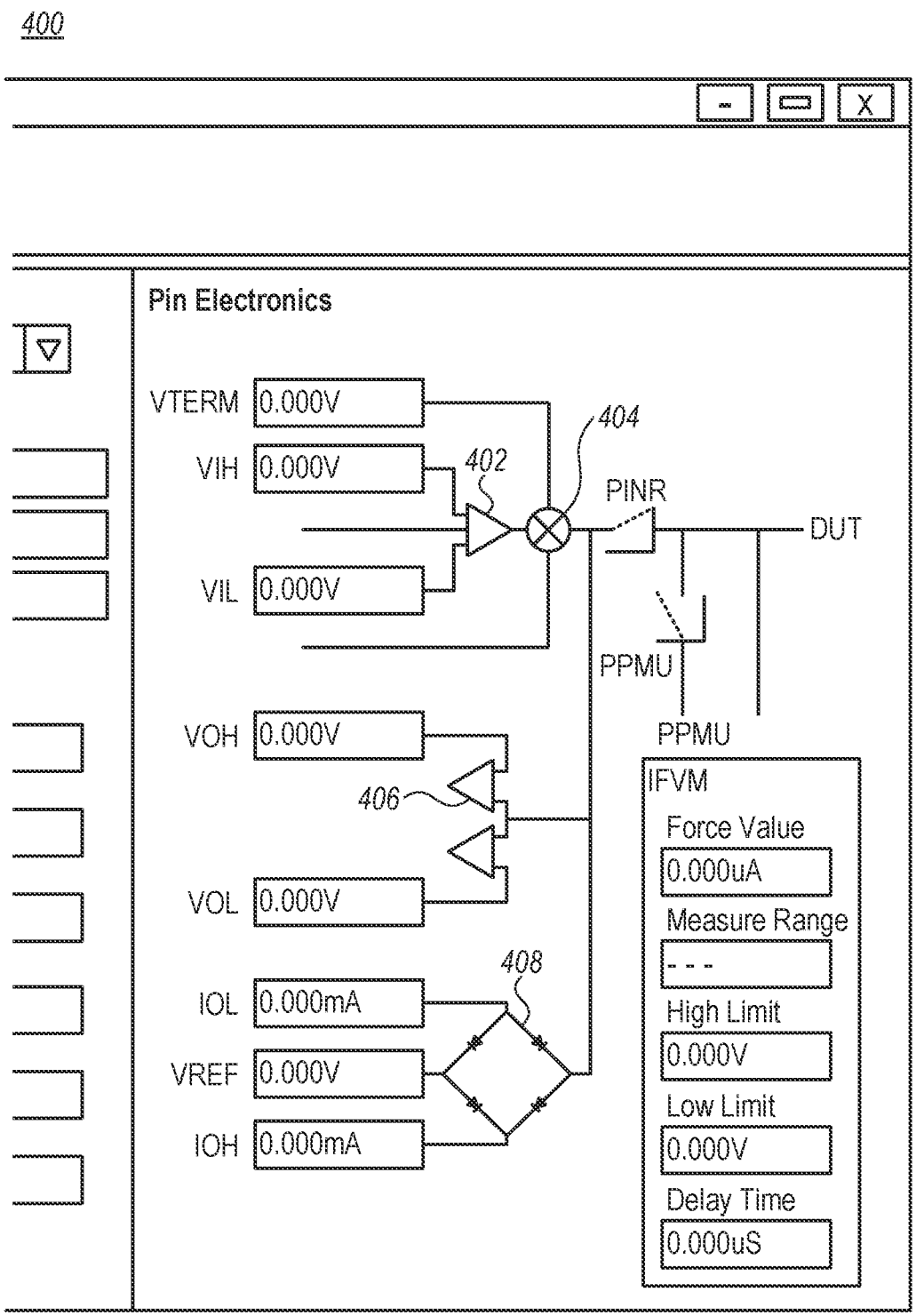
FIG. 4 is a pin-electronics setup screen shot of an ATE, in accordance with an embodiment of the present invention.

FIG. 4 is a pin-electronics setup screen shot 400 of an ATE, in accordance with an embodiment of the present invention. The screen shot is part of the Graphic-User-Interface (GUI), which allows the user to easily program the PE setup.

The screenshot comprises a Programmable Driver 402 (302 in FIG. 3), which can drive the DUT pin with a configurable voltage level VIL or VIH (according to the dynamic test pattern); a Switch 404 (304 in FIG. 3), which is configured to connect Driver 302 to the DUT pin, according to the dynamic test pattern; VOH, VOL Comparators 406, which are configured to compare the voltage on the DUT pins with configurable VOH and VOL values; and, a Load Unit 408, comprising a diode bridge, with IOL and IOH current sources (similar to units 314, 310, and 312 of FIG. 3). All configurable parameters VIH, VIL, VOH, VOL, IOH, IOL and VREF can be configured using test scripts, or, by entering the desired values in the numerical-entry sub-windows shown in FIG. 4.

According to embodiments of the present invention, a user can program the ATE to measure input pin capacitance by measuring a signal rise time (or, in alternative embodiments, fall time) of the pin voltage, once with the DUT connected and once with the DUT disconnected. To measure a rise time, the ATE sets VREF=VOH+1.3V (or higher), IOL=I1 (e.g., 1 mA), VIL=0V (or other suitable level, less than VOL), VOL (e.g., =0.4V) and VOH (e.g., =2.0V). Then, at a first time slot, the ATE sets switch 402 on to assure that the pin will start at a low voltage, and in a subsequent second time slot the ATE sets the switch off. The voltage on the pin will rise, with a slope determined (mainly) by the current source and the capacitance. By repeating the test described above, varying the time in which the output of comparators 406 is sampled, the tester can measure the rise time of the voltage on the pin, from VOL to VOH, and, calculate the capacitance C=Tr*I/(VOH−VOL). (Note that the definition for Tr in the current example includes only the time that the signal slopes from VOL to VOH.)

Timing measurement can also be done by measuring a falling edge on the DUT pin. To measure a fall time, the ATE sets VREF=VOL−1.3V (or lower), IOH=I1 (e.g., −1 mA), VIH=5V (or other suitable level, more than VOH), VOL (e.g., =0.4V) and VOH (e.g., =2.0V). In the first time slot, when the ATE sets switch 402 on, the pin will start at a high voltage. In the second time slot the voltage on the pin will fall. By Repeating the test described above, varying the time in which the output of comparators 406 is sampled, the tester can measure the fall time of the voltage on the pin, from VOH to VOL, and, calculate the capacitance C=Tf*I/(VOH−VOL).

As would be appreciated, screen shot 400 described above is cited by way of example. In alternative embodiments the values of VIH, VIL, VOH, VOL, IOL, IOH and VREF can be programmed using any other GUI, or, for example, using non-graphical programming scripts.

FIG. 5 is a DC setup screen shot 500 of an ATE, in accordance with an embodiment of the present invention. The screen shot comprises two Set Level commands 502 and 504, for setting a positive (Pull-Up) and a negative (Pull-Down) edge, respectively. Set Level commands are typically embedded in static configuration scripts.

In the example embodiment described in FIG. 5, a Set Level command receives eight ordered arguments:
1. A pin name argument 506;
2. A logic-low drive level argument 508 ("VIL"), which may be used to set the starting level of the slope for Tr measurement;
3. A logic high drive level argument 510 ("VIH"), which may be used to set the starting level of the slope for Tf measurement;
4. A logic-low compare threshold argument 512 ("VOL");
5. A logic-high compare threshold argument 514 ("VOH");
6. A logic-low load argument 516 ("IOL");
7. A logic-high load argument 518 ("IOH"); and,
8. A diode-bridge v-reference argument 520 ("VREF"), which may be set to a high level for rising edges and to a low level for falling edges.

Further arguments may be passed by the set level command, which are not relevant to the present invention and will not be described.

FIG. 6 is a screen shot 600 of an ATE test pattern, in accordance with an embodiment of the present invention. According to the example embodiment of FIG. 6, the test pattern comprises a PIN_PAT part, wherein an ordered list of pin names is defined; a WAVE part (3600_WAVE in the figure), wherein symbols to be used in the main-pattern part are defined, and a main-pattern part (MAIN_PAT in the figure), which defines the programming of all pins in all time slots of the pattern. (The PIN_PAT and WAVE part are configuration scripts, whereas the MAIN_PAT part is the dynamic test-pattern).

According to the example embodiment of FIG. 6, an ATE time slot is divided to six separately programmable "periods". The timing of the periods is defined in a "timing-set" line, which is part of the test setup (e.g. a configuration script) and is not shown. It should be noted that the periods are not necessarily mutually exclusive.

Each line of the WAVE part of the test-pattern comprises:
1. A symbol, or a pair of lower-case and upper-case symbols. The symbols will be used in the dynamic test pattern. When a pair of lower-case and upper-case letters is indicated, the lower-case letter indicates logic-low level, and the upper-case letter indicates logic high level.

2. Following the equal sign, six indications to the six states of the PE, during the six periods of the time slot.

3. Additional symbol information (not relevant to the present invention).

The six periods of a time slot are referred to hereinbelow as T1 through T6. T1 and T2 define drive periods. T3 and T4 define switching from drive to compare (but can be also used to define drive periods, like T1 and T2). T5 and T6 define compare periods (T5 and T6 were referred to, respectively, as T1 and T2 in the generic description of FIG. 3).

Definition of the Period Terms Used in the WAVE Part (First Six Parameters Following the Equal Sign):

DX: Drive, value=x (don't care). The PE setting during this period will not change (remains as it was in the previous period).

IOFF: The PE is comparator at that period (driver 402 of FIG. 4 is turned off).

ION: driver 402 is turned on

SX: S for strobe and X for don't care. The ATE is in compare mode but ignores fail/pass results (yet IOH and IOL are on).

DTP: Drive data. Drive 0 or 1, according to the case of the symbol in the pattern part (e.g., for a/A symbol, drive the pin with logic low when an "a" is indicated in the pattern, and with logic-high when an "A" is indicated).

D1: Drive a logic "1" at that period, regardless of the pattern data.

DTP/: Similar to DTP, but the driven data is inverted (i.e. drive low for an upper-case pattern symbol; drive high for a lower-case symbol).

h/H labels—same as above.

STP: Compare.

The third part of the test pattern is the dynamic pattern (MAIN_PAT). The pattern comprises a commented pin-name header, followed by lines of symbols. The lines correspond to consecutive time slots; each line comprises symbols, wherein consecutive symbols define the pattern at the corresponding time slot, for consecutive PE modules.

The symbol "Super0_0", at the end of each pattern line, specifies a "timing set", which is part of the test configuration script and defines the timing values for the six periods.

In the example embodiment of FIG. 6, the ATE measures timing on a CLK pin 602. The CLK pin may assume format 604, or an h/H format 606, wherein format a/A 604 is defined as:

DTP in period 1 (drive data)
DX in period 2—continue driving data
ION in period 3—Driver 402 (FIG. 4) is turned on
DX in period 4—no change from period 3
SX in periods 5 and 6—compare but ignore the results (IOL and IOH are off since ION is programmed in T3);

And, format h/H is defined as:
DX in period 1—continue the state of the last period of the previous time slot;
DX in period 2—continue the previous state;
IOFF in period 3—Driver 402 (FIG. 4) is turned off;
DX in period 4—no change from period 3;
STP in period 5—compare data to the symbol in the pattern;
STP/in period 6—compare data to the inverse of the symbol in the pattern.

In the pattern part of the screenshot, during a sixth time slot 608 CLK pin 602 (and all other pins except the Reset pin) assume an "a" format and drive the corresponding pins with 0V (according to 508, FIG. 5). During a seventh time slot 610, CLK pin 602 (and all other pins except the Reset pin) assume an h format, to check that the logic value at the line is 0 at period 5 and high at period 6.

The ATE can then, by varying the timing of the fifth and the sixth time periods, measure the time that the pin voltage reaches 1V and 2V (512 and 514, FIG. 5), when the pin is charged by a 1 mA current source (516, FIG. 5).

Thus, according to the example embodiment of FIGS. 5,6, a commercial Chroma 3650 tester can be programmed to measure a rise or a fall time at a given load current and calculate the capacitance of any input pin of a DUT, utilizing a method according to embodiments of the present invention.

The settings and the programming of the various units of the Chroma 3650 ATE and Chroma 3650 screen shots, shown in FIGS. 4 through 6, are examples that are shown purely for the sake of conceptual clarity. Any other suitable settings, programing and screenshots can be used in alternative embodiments. The setting and programming are suitable for a Chroma tester; setting and programming for other testers may vary according to the hardware setup and the programming interface of other testers, and different screen shots may apply.

PE 104 (FIG. 1) may be a single integrated circuit, an aggregation of a plurality of integrated circuits, a multi-chip-carrier or a PCB. In some embodiments, groups of PEs, or all PEs, may be aggregated in the same physical enclosure (for example—in a single integrated circuit).

Parts of ATE 100, such as Controller 102, may be implemented by hardware, by software, or by combination of hardware and software. Controller 102 and/or PE 104 may be a Field-Programmable-Gate-Array (FPGA), an Application Specific Integrated Circuit (ASIC), or a combination of FPGA and ASIC.

In some embodiments, controller 102 comprises a general-purpose programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for testing and measurement of a pin of an electronic device, the method comprising:
   using Pin Electronics (PE), connecting to the pin, driving the pin with electrical currents and measuring electrical voltages on the pin; and
   using a controller:

when the pin serves as an output pin, applying Direct-Current (DC) testing or Alternating-Current (AC) testing to the output pin using the PE, by measuring voltages on the output pin in response to currents; and when the pin serves as an input pin, applying to the input pin, using the same PE, a capacitance test that measures an input capacitance of the input pin by driving the input pin with multiple predefined currents and measuring respective voltages that form across the input pin in response to the predefined currents.

2. The method according to claim 1, wherein applying the capacitance test comprises deriving from the voltages a voltage slope as a function of time, and calculating the input capacitance from the voltage slope.

3. The method according to claim 1, wherein applying the capacitance test comprises obtaining first and second capacitance measurements by prompting a user to disconnect the pin from the PE before obtaining the first capacitance measurement, and prompting the user to connect the pin to the PE before obtaining the second capacitance measurement, and calculating the input capacitance of the pin from the first and second capacitance measurements.

4. An apparatus for testing and measurement of a pin of an electronic device, the apparatus comprising:

Pin Electronics (PE), which is configured to connect to the pin, to drive the pin with electrical currents and to measure electrical voltages on the pin; and a controller, which is configured to:
when the pin serves as an output pin, apply Direct-Current (DC) testing or Alternating-Current (AC) testing to the output pin using the PE, by measuring voltages on the output pin in response to currents; and when the pin serves as an input pin, apply to the input pin, using the same PE, a capacitance test that measures an input capacitance of the input pin by driving the input pin with multiple predefined currents and measuring respective voltages that form across the input pin in response to the predefined currents.

5. The apparatus according to claim 4, wherein the controller is configured to derive from the voltages a voltage slope as a function of time, and to calculate the input capacitance from the voltage slope.

6. The apparatus according to claim 4, wherein, in applying the capacitance test, the controller is configured to prompt a user to disconnect the pin from the PE before obtaining a first capacitance measurement, to prompt the user to connect the pin to the PE before obtaining a second capacitance measurement, and to calculate the input capacitance of the pin from the first and second capacitance measurements.

7. A computer software product for testing and measurement of a pin of an electronic device, the product comprising a tangible non-transitory computer-readable medium in which program instructions are stored, which instructions, when read by a processor that is coupled to Pin Electronics (PE) configured to connect to the pin, causes the processor to:

when the pin serves as an output pin, conduct Direct-Current (DC) testing or Alternating-Current (AC) testing on the output pin, using the PE, by measuring voltages on the output pin in response to currents; and when the pin serves as an input pin, apply to the input pin, using the same PE, a capacitance test that measures an input capacitance of the input pin by driving the input pin with multiple predefined currents and measuring respective voltages that form across the input pin in response to the predefined currents.

* * * * *